(12) United States Patent  
Geiger et al.

(10) Patent No.: US 9,057,748 B2  
(45) Date of Patent: Jun. 16, 2015

(54) ASSEMBLY AND METHOD FOR TESTING AN ELECTRONIC CIRCUIT TEST FIXTURE

(71) Applicant: Dell Products L.P., Round Rock, TX (US)

(72) Inventors: Philip B. Geiger, Round Rock, TX (US); Ying Qi, Shanghai (CN); Ping-Hua Shentu, Shanghai (CN)

(73) Assignee: Dell Products, L.P., Round Rock, TX (US)

( * ) Notice: Subject to any disclaimer, the term of this patent is extended or adjusted under 35 U.S.C. 154(b) by 199 days.

(21) Appl. No.: 13/894,121

(22) Filed: May 14, 2013

(65) Prior Publication Data

US 2014/0340104 A1 Nov. 20, 2014

(51) Int. Cl.  
*G01R 31/20* (2006.01)  
*G01R 35/00* (2006.01)  
*G01R 31/02* (2006.01)

(52) U.S. Cl.  
CPC .............. *G01R 35/00* (2013.01); *G01R 31/026* (2013.01)

(58) Field of Classification Search  
USPC ............... 324/750.15–750.26, 750.3–754.13, 324/755.1–758.01, 754.01, 754.03, 500, 324/755.03; 29/846, 705, 827  
See application file for complete search history.

(56) References Cited

U.S. PATENT DOCUMENTS 4,724,383 A * 2/1988 Hart ......................... 324/750.25  
5,990,696 A * 11/1999 Swart ....................... 324/750.24

* cited by examiner

*Primary Examiner* — Melissa Koval  
*Assistant Examiner* — Trung Nguyen  
(74) *Attorney, Agent, or Firm* — Isidore PLLC

(57) ABSTRACT

A method provides testing of an electronic circuit test system that includes a test fixture having headed and headless test probes, a shorting plate and a test probe verification plate with apertures. A probe verification test includes: moving the test probe verification plate and the shorting plate into position, where the shorting plate engages any test probe that extends through an aperture of the verification plate; and transmitting an electrical signal to each of the test probes. The electricity flow associated with each of the test probes is analyzed to determine if any of the headless test probes have an open circuit. In response to detecting an open circuit: one or more of the headless test probes are indicated as (a) defective in the test fixture or (b) missing from the test fixture; and the specific locations in the test fixture of the defective or missing test probes are identified.

20 Claims, 8 Drawing Sheets

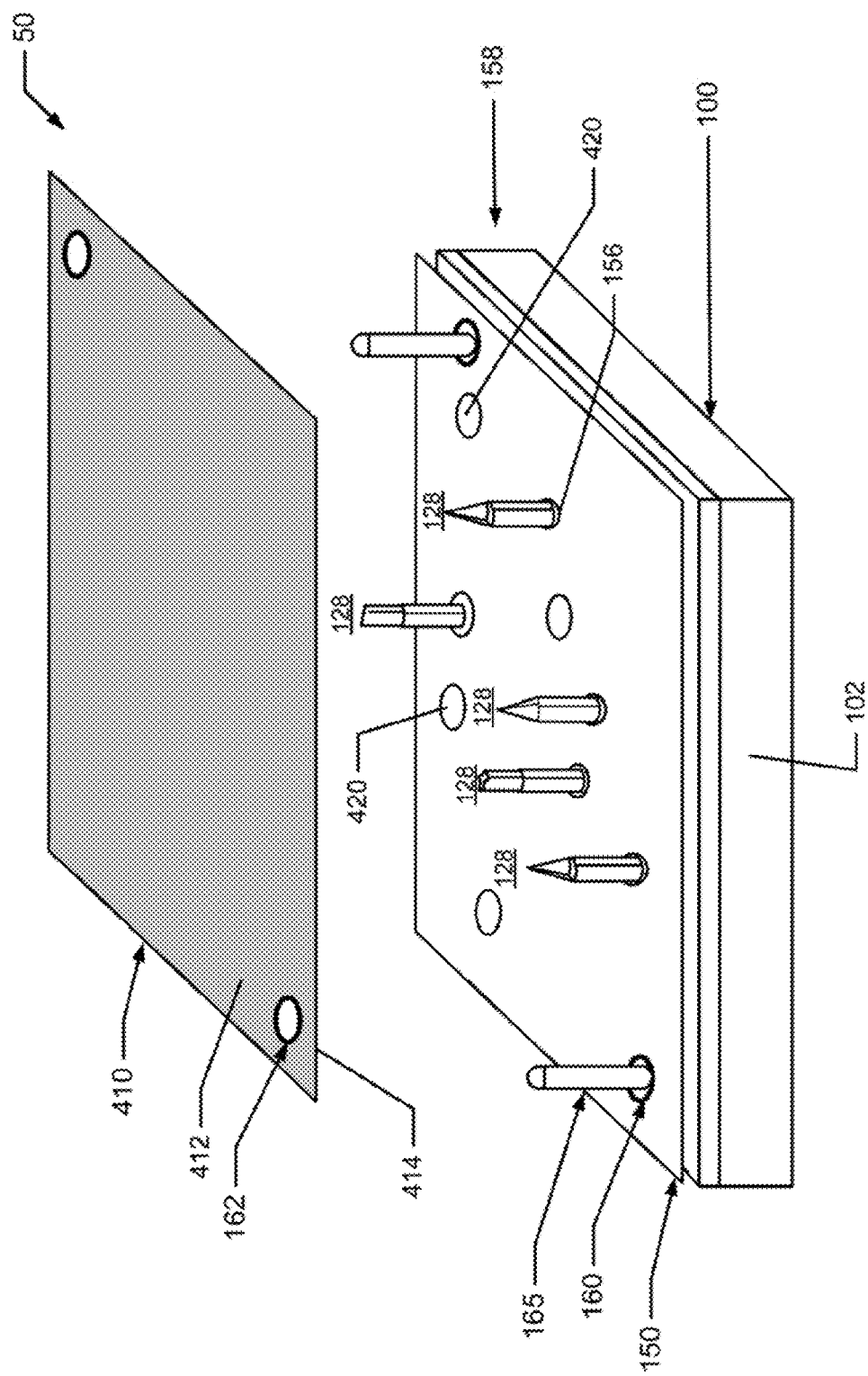

ASSEMBLY AND METHOD FOR TESTING AN ELECTRONIC CIRCUIT TEST FIXTURE

BACKGROUND

1. Technical Field

The present disclosure generally relates to the testing of electronic circuits and in particular to testing an electronic circuit test system that is used to test printed circuit board assemblies (PCBAs).

2. Description of the Related Art

As the value and use of information continue to increase, individuals and businesses seek additional ways to process and store information. One option available to users is information handling systems. An information handling system (IHS) generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

IHSes typically contain one or more printed circuit board assemblies (PCBAs), which are manufactured and tested prior to installation into the HIS. During manufacturing of the PCBAs, electronic circuit test systems are used for testing printed circuit board assemblies (PCBAs) of various types. An electronic circuit test system is particularly suited to testing PCBAs (such as computer motherboards) with large quantities of devices under test (DUT). Examples of devices under test include resistors, capacitors, inductors, transistors, and integrated circuit devices. A typical electronic circuit test system includes a test fixture that is populated with a large number, or array, of test probes. An electrical signal can be selectively applied to each of the test probes by the electronic test system. The PCBA is typically moved into contact with the test probes via vacuum or mechanical test fixture actuation. Some test fixtures contain thousands of individual test probes in a large matrix. For example, a laptop motherboard typically requires approximately 1500 test probes and a server motherboard typically requires over 6000 test probes. In addition, several different types of test probes are typically used in a single test fixture depending upon the specific DUT to be tested.

The test probes are prone to damage and wear during use over a large number of test cycles, and the test probes require periodic maintenance. The replacement of worn test probes is a tedious manual procedure that must be performed by a human operator. Because there are thousands of test probes that may need to be removed and replaced, it is common for errors and mistakes to be made during such maintenance operations. The possible types of operator mistakes include installing a test probe in a location that does not require a test probe, omitting a test probe in a location that requires a test probe and installing the wrong type of test probe for a specific test fixture position. It is particularly difficult to determine if an incorrect type of test probe has been installed in a specific test fixture location or position. Incorrect test probes in the test fixture can cause false test results or cause damage to the PCBA.

BRIEF SUMMARY

Disclosed is a method and an assembly for automated verification of the installation correctness of test probes in an electronic circuit test fixture.

According to one embodiment, the method includes: providing a test fixture having a plurality of test probes, the test probes including one or more headed test probes and one or more headless test probes; providing a conductive shorting plate; and providing a verification plate that has apertures at specific locations relative to expected positions of the one or more headed and one or more headless probes on the test fixture. Each aperture has a perimeter dimension or orientation that allows the headless probe to pass through the aperture, but prevents the headed probe from passing through the aperture. The method also includes positioning the verification plate relative to the test fixture such that the plurality of apertures align with positions of the test probes of the test fixture, such that the one or more headless probes positioned in alignment with a corresponding aperture extends through the corresponding aperture, while each headed probe is prevented from extending through an aperture with which the headed probe is aligned. The method then includes executing at least one of a shorted probe test, a probe presence test, and a probe verification test. The combination of these tests identifies whether the headed probes and the headless probes are all present and correctly placed in the test fixture.

According to one embodiment, the probe verification test includes: moving the shorting plate into a position at which the shorting plate would engage with any test probe that extends through its corresponding aperture of the verification plate; transmitting an electrical signal to each of the test probes; and analyzing the electricity flow associated with each of the test probes to determine if any of the expected headless test probes have an open circuit. In one embodiment, the analyzing further includes comparing a location of each headless test probe that provided a closed circuit with a pre-established probe location mapping for all of the headless test probes that should exist on a correctly configured test fixture. The pre-established probe location mapping provides a correct location for each headless test probe and each headed test probe on the test fixture. In response to detecting an open circuit at locations of the test fixture at which one or more of the headless test probes are expected to be provided on the test fixture, one or more of the headless test probes are indicated as one of (a) defective in the test fixture and (b) missing from the test fixture. Alternatively, the open circuit can also indicate that one or more of the headed probes are incorrectly installed in a location designed for a headless probe. At least one corresponding location is identified in the test fixture of a defective or missing headless test probe or an incorrectly installed headed probe.

Also disclosed is an assembly for testing an electronic system, the assembly comprising: a test fixture having a plurality of test probes that include one or more headed test probes, one or more headless test probes; a conductive shorting plate; and a verification plate. The verification plate is configured with through apertures at specific locations relative to expected positions of the one or more headed and one or more headless probes on the test fixture. Each aperture has a perimeter dimension or orientation that allows a headless probe to pass through the aperture, but prevents a headed probe from passing through the aperture. The verification plate is positioned relative to the test fixture such that each of the plurality of apertures is aligned with a position of a test probe of the test fixture. With this alignment of the verification plate, the one or more headless probes positioned in alignment with a corresponding aperture extends through the corresponding aperture, while each headed probe is prevented from extending through an aperture with which the headed probe is aligned.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 4A illustrates a perspective view of an assembly of the test fixture with the test probe verification plate placed on top of and physically inter-coupled with the apertures to corresponding headless test probes, in accordance with one or more embodiments;

DETAILED DESCRIPTION

Figure 1:
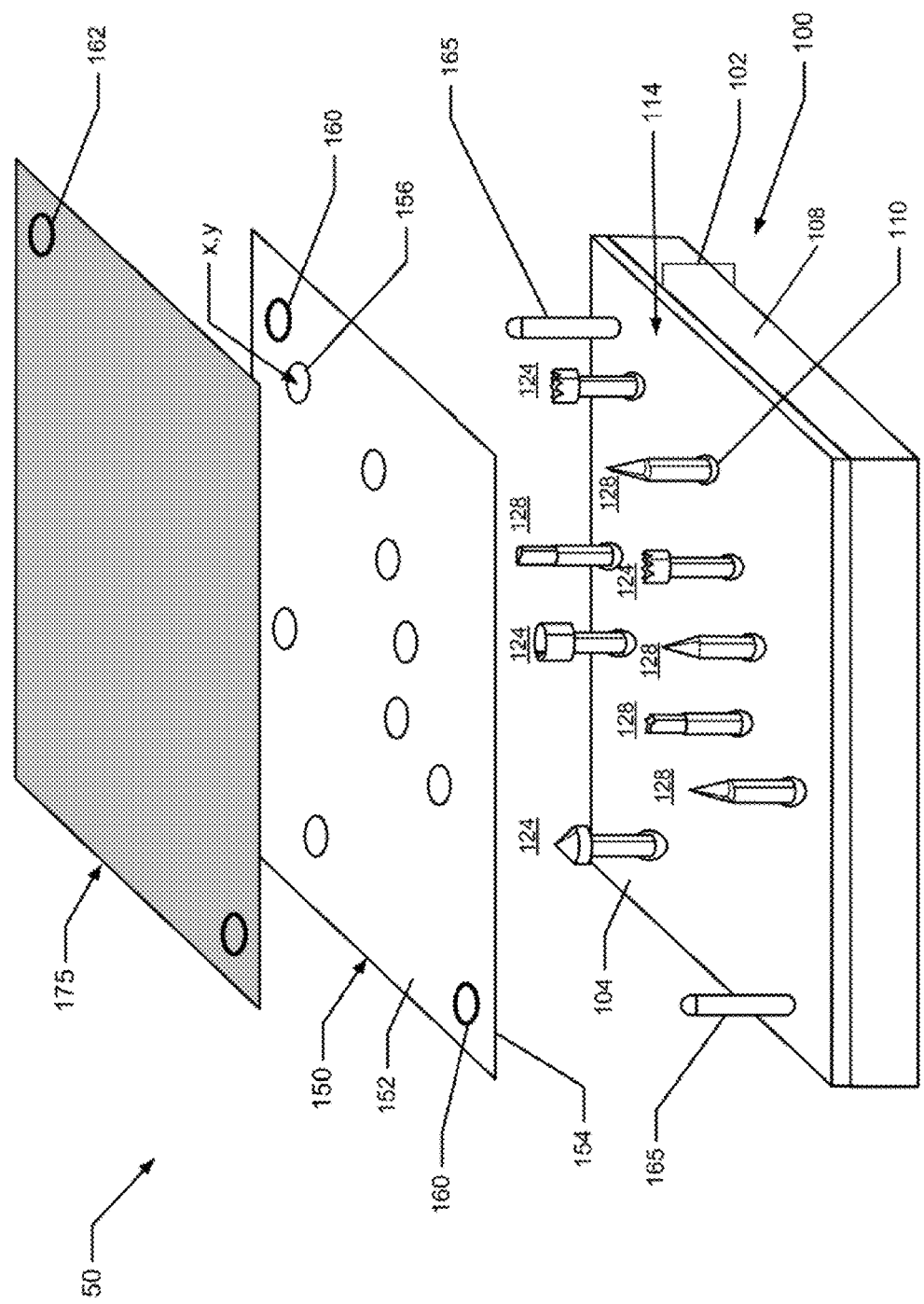
FIG. 1 illustrates a perspective view of a test fixture with probes, test probe verification plate, and shorting plate, according to one or more embodiments.

The illustrative embodiments provide a method of testing a test fixture having headed test probes and headless test probes by using a shorting plate and a test probe verification plate that has several apertures. A probe verification test is executed including placing the shorting plate and test probe verification plate into a position where the shorting plate engages any test probe that extends through its corresponding aperture on the test probe verification plate and transmitting an electrical signal to each of the test probes. The electricity flow associated with each of the test probes is analyzed to determine if any of the expected headless test probes have an open circuit or if any of the expected headed probes have a short circuit. Detecting an open circuit on the expected headless probe or a short circuit on the expected headed probe indicates that one or more of the test probes are one of (a) defective in the test fixture, or (b) missing from the test fixture or (c) the wrong type of probe. The method also includes identifying locations in the test fixture of the defective or missing test probes.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

FIG. 1 illustrates an apparatus or assembly 50 for testing an electronic circuit test fixture, within which one or more of the described features of the various embodiments of the disclosure can be implemented. Referring specifically to FIG. 1, the assembly 50 for testing an electronic circuit test system comprises a test fixture 100. Test fixture 100 includes a generally rectangular shaped housing 102 that encloses an interior cavity (not shown). Housing 102 can be formed from suitable materials such as metals or plastic. A probe plate 104 is mounted above housing 102. Housing 102 has a bottom surface and four side surfaces 108.

An array of probe receptacles 110 are defined in probe plate 104. Receptacles 110 extend entirely through probe plate 104 into the interior cavity of test fixture 100. Test probes, which include headed test probes 124, and headless test probes 128, are inserted into the receptacles in the probe plate 104 of the test fixture, and the test probes 124/128 extend above the receptacles. Test probes 124/128 are made from an electrically conductive material such as bronze or gold plated steel.

The test probes 124/128 are used to contact test points on a PCBA (not shown). Typically, the headed test probes 124 are used to contact pin-through-hole component leads on the circuit board assembly. The headless test probes 128 are used to contact via pads, test pads, or surface mount attachment pads on the circuit board assembly. While nine test probes 124/128 are shown in FIG. 1, it is understood that test probes 124/128 can number in the hundreds or thousands of test probes. The array of test probes 124/128 is spaced in a matrix at various positions or locations (having x, y coordinates as shown in the example figure) in test fixture 100.

The assembly 50 for testing an electronic circuit test fixture also includes a test probe verification plate 150. Test probe verification plate 150 can be generally rectangular in shape and can be formed from suitable materials such as glass reinforced epoxy laminate sheets (e.g. G10 or FR4) or other suitable non-conductive material. Test probe verification plate 150 has a top surface 152 and bottom surface 154 and includes an array of apertures 156 that extend entirely through the test probe verification plate 150. The apertures 156 are spaced at various aperture positions or locations (indicated as an x,y coordinate) in test probe verification plate 150. Each aperture 156 is positioned in the test probe verification plate 150 in coaxial alignment with each individual headed test probe 124 and with each headless test probe 128.

In one embodiment, apertures 156 are circular and have various diameters based on the types of headless and headed probes used in the test fixture. In other embodiments, apertures 156 have a non-circular shape or orientation such as oval or rectangular and include at least one minor or smaller dimension. In order to ensure that the apertures 156 align with the correct test probes, test fixture 100 is configured with the tooling pins 165, while test probe verification plate 150 includes one or more corresponding tooling holes 160. The combination of the tooling pins 165 and the tooling holes 160 serve to guide the test probe verification plate 150 into the correct position, relative to the test fixture and probes located thereon. Also, as provided for in FIG. 4, described hereafter, the tooling pins 165 are also utilized to guide the placement of a shorting plate 175, which is also configured with tooling holes 162.

In the following description of the various figures, reference is also made to elements described in preceding figures, and like elements are provided the same reference numerals throughout the description of the various figures. As an example, in the description of FIGS. 2 and 3, reference is also made to elements described in FIG. 1.

Figure 2:
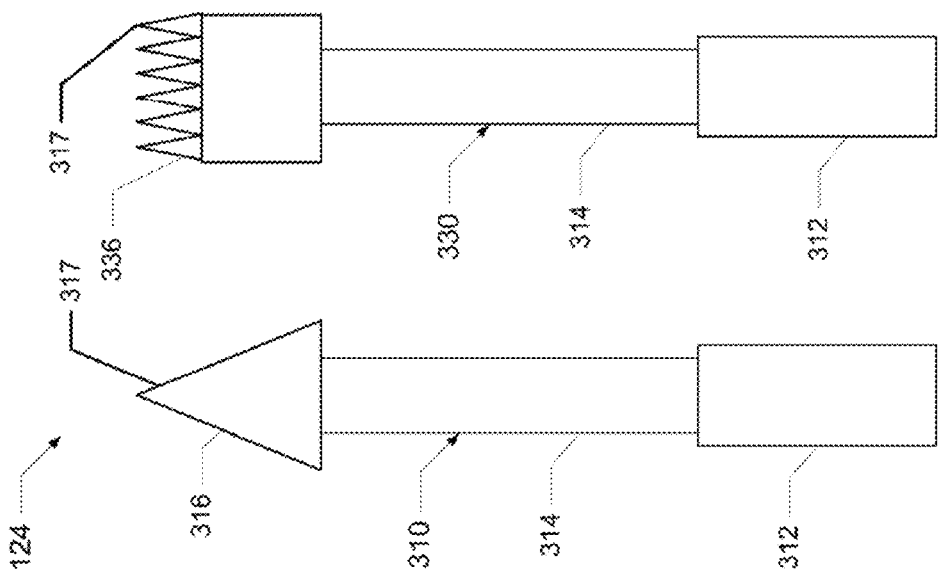
FIG. 2 illustrates a side view of several example headless test probes in accordance with one or more embodiments.

With reference to FIG. 2, there are illustrated details of example headless test probes 128. Headless test probes 128 include example headless test probe styles 210 and 230. Headless test probes 210 and 230 are similar except that each has a different shaped terminal end or probe tip. Many more headless probe styles exist than are described in this document. Headless test probe example 210 is an elongated cylinder in shape and has a probe tube 212, a plunger 214 and a terminal end or probe tip 216. Example probe tip 216 has a single triangular shaped prong 217. Headless test probe example 230 is an elongated cylinder in shape and has a probe tube 212, a plunger 214 and a terminal end or probe tip 236. Example probe tip 236 has multiple triangular shaped prongs 217. The probe tubes 212 are received by or inserted into receptacles 110 of test fixture 100 (FIG. 1).

Figure 3:
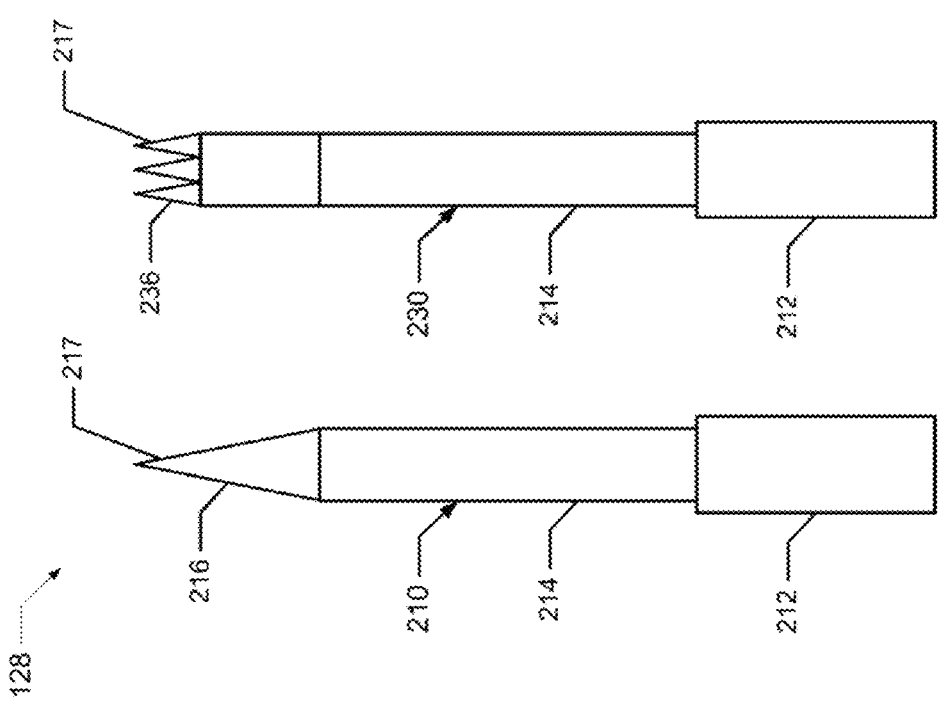
FIG. 3 illustrates a side view of several example headed test probes in accordance with one or more embodiments.

Referring to FIG. 3, details of headed test probes 124 are shown. Headed test probes 124 include example headed test probe styles 310 and 330. Headed test probes 310 and 330 are similar except that each has a different shaped terminal end or probe tip. Many more headed probe styles exist than are described in this document. Headed test probe example 310 is an elongated cylinder in shape and has a probe tube 312, a plunger 314 and a terminal end or probe tip 316. Example probe tip 316 has a single triangular shaped prong 317. Headed test probe example 330 is an elongated cylinder in shape and has a probe tube 312, a plunger 314 and a terminal end or probe tip 336. Example probe tip 336 has multiple triangular shaped prongs 317 on a cylindrical base 337. The probe tubes 312 are received by or inserted into receptacles 110 of test fixture 100 (FIG. 1).

It is appreciated that for purposes of this disclosure, except for the type of probes, from among a headed probe and a headless probe, that is placed at each of the probe locations of the test fixture, the exact configuration of the test probes are not relevant to the overall understanding of the disclosure. The specific presentation herein of the probes and test fixture, and other parts of the overall system are presented simply to explain how exactly the test probe verification plate 150 is configured and utilized to test for the correct installation of headed and headless test probes in the test fixture.

Figure 4B:
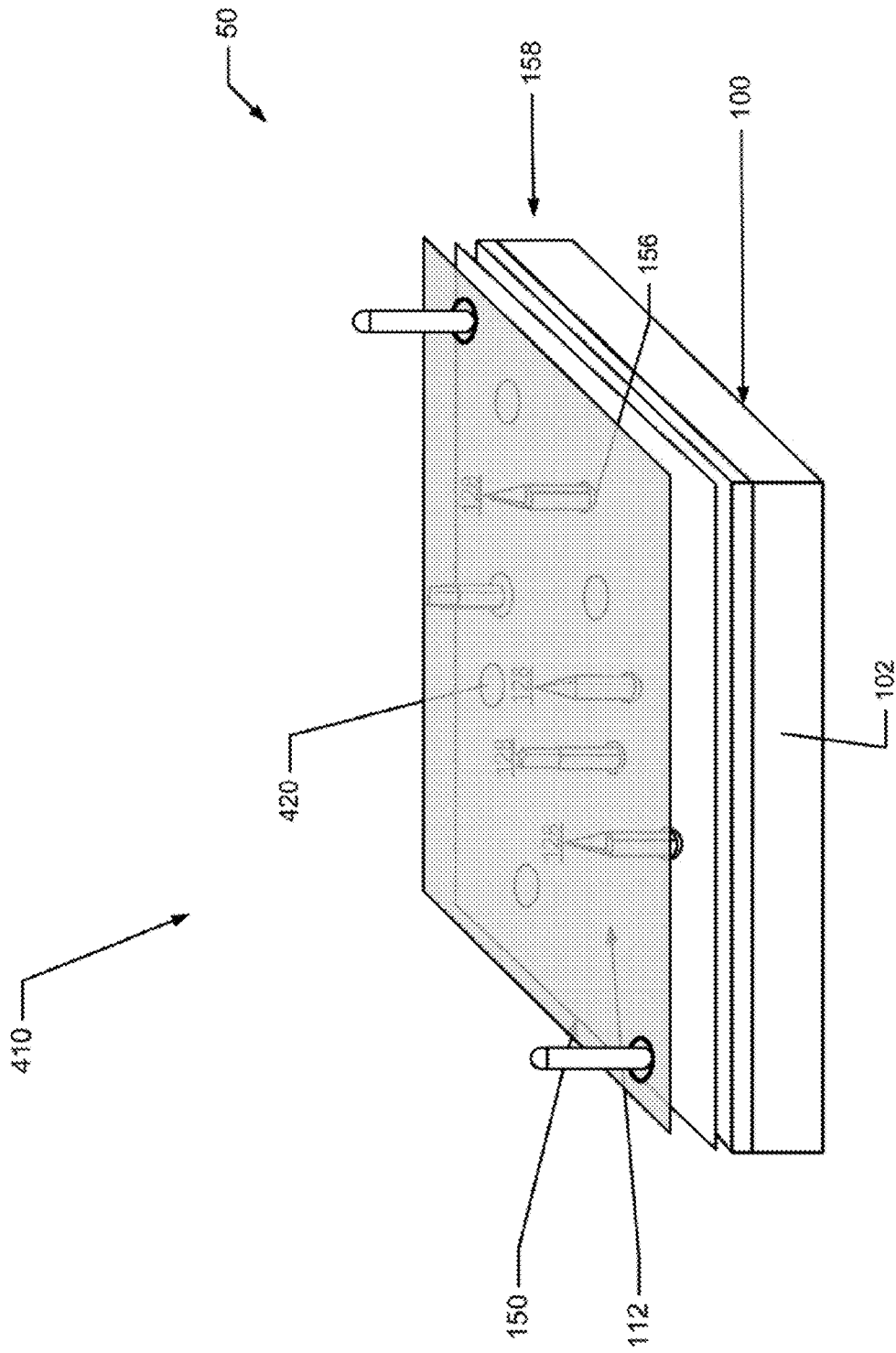
FIG. 4B illustrates a second perspective view of the assembly of the test fixture with the test probe verification plate placed as in FIG. 4A, with a shorting plate placed atop and completing the assembly, in accordance with one or more embodiments.

FIGS. 4A-4B illustrate two views of the assembly 50 for testing an electronic circuit test fixture with the test probe verification plate 150 placed in a testing position, followed by the shorting plate 410 being placed in a testing position. In one implementation, FIGS. 4A and 4B represent a time sequence of placing the components to complete one or more tests of the probes, as described herein. As illustrated within these figures, probe testing assembly 50 further includes a conductive shorting plate 410. Shorting plate 410 is generally shaped to allow shorting plate 410 to be able to simultaneously interface with all of the test probes 124/128 in test fixture 100. Shorting plate 410 has a top surface 412 and a bottom surface 414. Shorting plate 410 can be formed from a conductive material such as copper, an alloy of copper, or aluminum. Test probe verification plate 150 and shorting plate 410 are moved or positioned by an operator during testing of the assembled test fixture (with probes inserted) as will be described later.

In FIG. 4A, test probe verification plate 150 is shown placed in a testing position, while shorting plate 410 has not yet contacted the exposed headless test probes 128. This view enables an understanding of the placement of test probe verification plate 150 relative to both the exposed headless probes and the shorting plate, when in a testing configuration. However, according to one or more embodiments, during actual testing operation, the shorting plate 410 is placed on top of the test probe verification plate 150. Thus, in these embodiments, the combination of shorting plate 410 and test probe verification plate 150 are moved in concert, in a downward direction, towards test fixture 100. As the test probe verification plate 150 contacts the test probes, the headed test probes 124 and the headless test probes 128 are in axial alignment with corresponding respective apertures 156 in test probe verification plate 150 such that with continued downward movement of test probe verification plate 150, the headless test probes 128 pass through apertures 156 and extend above top surface 152 (FIG. 1), while the headed probes, which are also in axial alignment with corresponding headless test probe apertures 420, do not pass through the apertures 156 (due to probe head diameter or size constraints). The diameter of apertures 156 is greater than the diameter of the headless test probes 128 such that the headless test probes 128 can pass through apertures 156. However, the diameter of the apertures 156 is smaller than the diameter of headed probes 124 such that the headed probes cannot pass through the apertures. In one example embodiment, apertures 156 have a diameter of 40 mils, the headless test probes 128 have a diameter of 36 mils, and the headed test probes 124 have a diameter of 62 mils.

Any headless test probes 128 that are missing from test fixture 100 or any headed test probes 124 that are incorrectly installed in test fixture 100 will result in an empty opening 420. Any headless test probes 128 that are missing from test fixture 100 will not be available to pass through aperture 156 resulting in the empty opening 420. Any headed test probes 124 that are incorrectly installed in a headless test probe location will not be able to pass through aperture 156 resulting in an empty opening 420.

At the same time, the headed test probes 124 are aligned with the bottom surface 154 in test probe verification plate 150 such that with continued downward movement of test probe verification plate 150, the headed test probes 124 are blocked by contact with bottom surface 154 (FIG. 1) surrounding apertures 156. This causes the headed test probes 124 to be compressed via the spring action of the probe, as known to those skilled in the art.

With the FIG. 4B configuration, the test probe verification plate 150 and shorting plate 410 are moved downwardly towards test fixture 100, until eventually the bottom surface 414 of shorting plate 410 will contact the probe tips 217 (FIG. 2A) of the headless test probes 128. The surface of the shorting plate 410 becomes electrically coupled to the probe tips heads of the headless test probes 128 extending through the test fixture 100 causing all of the headless test probes 128 to be shorted together in a short circuit. Any headless probes that are incorrectly placed will pass through the aperture causing a short circuit to be detected at that particular location (e.g., x,y probe location) of the test fixture 100.

As shown by both FIGS. 4A and 4B, using the respective tooling holes 160 and 162, the tooling pins 165 serve to guide the test probe verification plate 150 as well as the shorting plate 410 into the correct position, relative to the test fixture. This use of the tooling holes 160 and 162 and tooling pins 165 are aligned such that they ultimately align the apertures in the test probe verification plate 150 with the specific configuration and/or layout of test probes being analyzed.

Figure 5:
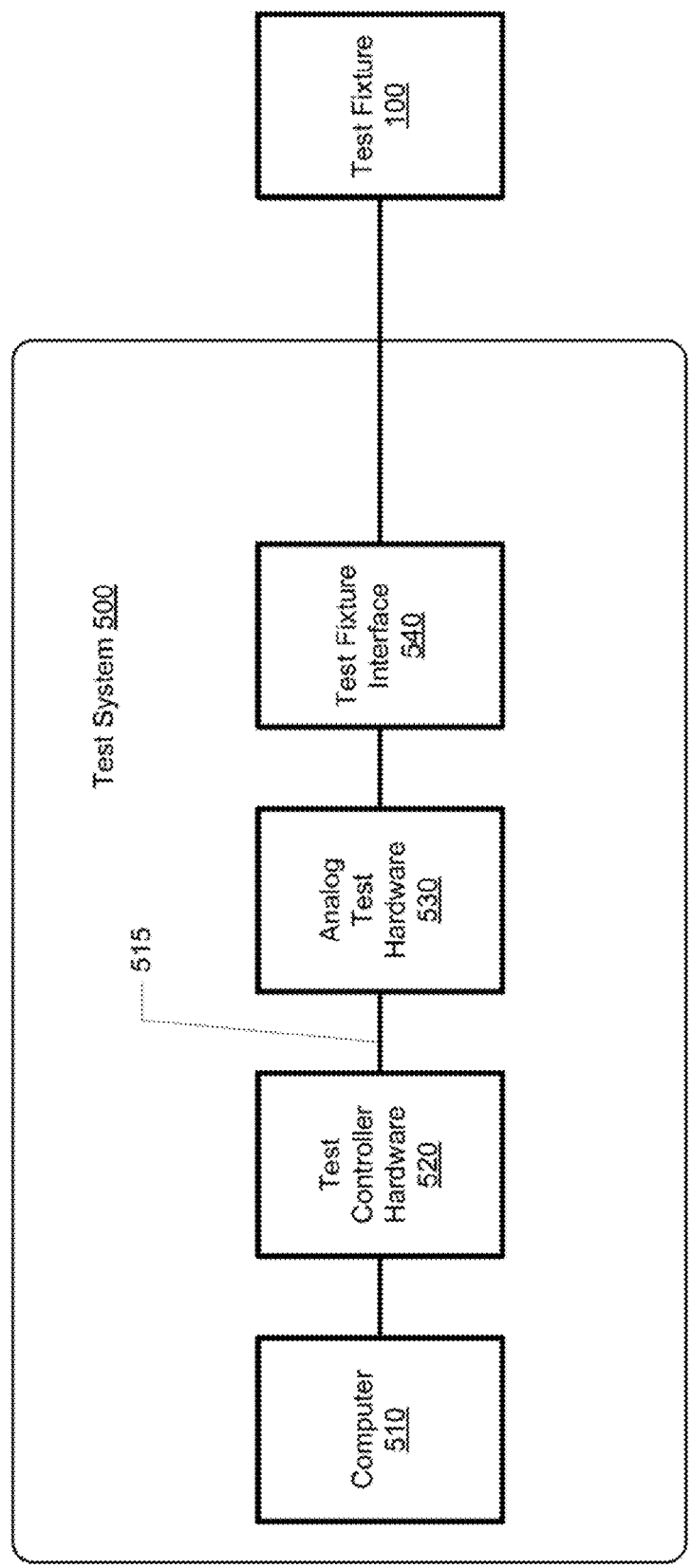
FIG. 5 illustrates a block diagram of functional components of a test system for use with the test fixture of FIGS. 1 and 4, in accordance with one or more embodiments.

FIG. 5 illustrates a block diagram representation of an example test system 500 for testing PCBAs using test fixture 100 with which the test probe verification plate 150 and shorting plate 175 can be advantageously implemented. Test system 500 comprises a computer 510 that is coupled to test controller hardware 520 which is coupled to analog test hardware 530. Analog test hardware 530 is coupled to test fixture interface 540 which is coupled to individual test probes 124, 128 (FIG. 1) in test fixture 100. The components of test system 500 are coupled to each other via respective interconnects, generally presented as a single connecting wire 515.

Figure 6:
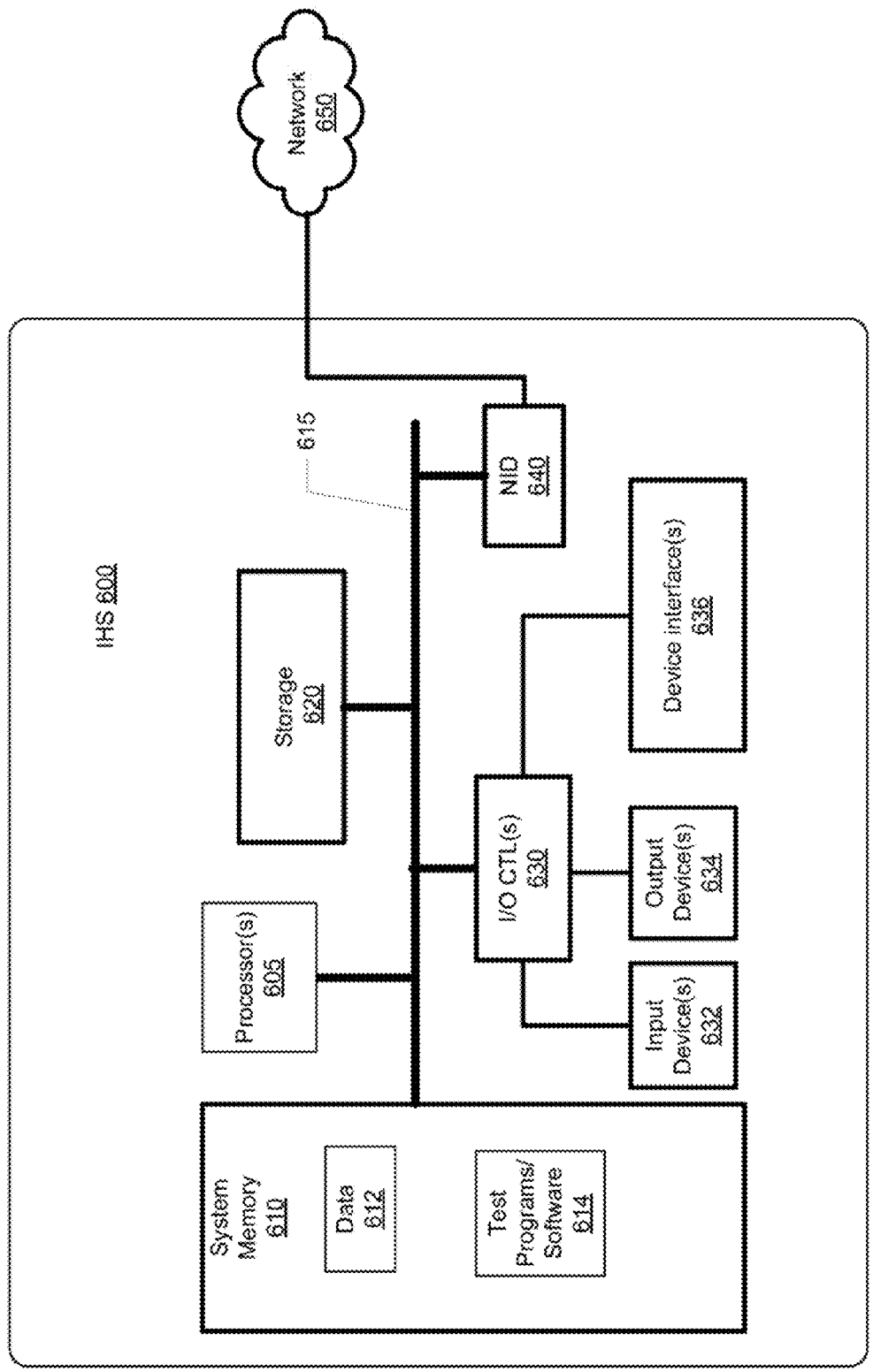
FIG. 6 illustrates an example information handling system within which several aspects of the disclosure can be implemented, according to one or more embodiments.

Computer 510 can be a conventional computer, as presented in FIG. 6, described hereafter. Software/firmware such as test programs can be stored on computer 510. Test controller hardware 520 interfaces with computer 510 and receives commands from computer 510, which controller hardware 520 forwards to analog test hardware 530. The analog test hardware 530 can include an ohmmeter that can be connected to connections of test fixture interface 540. The test fixture interface 540 is a mechanical interface that provides electrical connectivity to the bed-of-nails test fixture 100. This electrical connectivity is typically done through dedicated wiring or cables. In one or more embodiments, feedback signals from test fixture 100 and specifically from the individual test probes 124/128 can be routed to computer 510 for analysis thereof.

FIG. 6 illustrates a block diagram representation of an example information handling system (IHS) 600, within which one or more of the described features of the various embodiments can be implemented. In one embodiment, computer 510 of FIG. 5 can be generally represented by IHS 600, although other types of devices can be utilized to perform the functionality associated with computer 510. References to IHS 600 are understood to refer to computer 510 and both terms (and reference numerals) are utilized interchangeably herein. For purposes of this disclosure, an information handling system, such as IHS 600, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 6, example IHS 600 includes one or more processor(s) 605 coupled to system memory 610 via system interconnect 615. Also coupled to system interconnect 615 is local storage 620 within which can be stored software and one or more sets of data (not specifically shown). As shown, system memory 610 can include therein a plurality of modules, data 612 and test programs/software 614. Data 612 can contain information about test fixture 100 (FIG. 1) such as the locations of the headed and headless test probes. The various software and/or firmware modules have varying functionality when their corresponding program code is executed by processor(s) 605 or other processing devices within IHS 600.

IHS 600 further includes one or more input/output (I/O) controllers 630 which support connection to and processing of signals from one or more connected input device(s) 632, such as a keyboard, mouse, or touch screen. I/O controllers 630 also support connection to and forwarding of output signals to one or more connected output devices 634, such as a monitor or display device. Additionally, in one or more embodiments, one or more device interface(s) 636 provide an integration point for connecting other device(s) to IHS 600. In one such implementation, device interface(s) 636 can further include General Purpose I/O interfaces such as $I^2C$, SMBus, and peripheral component interconnect (PCI) buses and universal serial buses (USB). Device interface(s) 636 can be communicatively coupled to components of test system 500 such as test controller hardware 520 (FIG. 5).

In one or more embodiments, IHS 600 comprises a network interface device (NID) 640. NID 640 enables IHS 600 to communicate and/or interface with other devices, services, and components that are located external to IHS 600. These devices, services, and components can interface with IHS 600 via an external network, such as example network 650, using one or more communication protocols. Network 650 can comprise one or more direct connections to other devices as well as a more complex set of interconnections as can exist within a wide area network, such as the Internet.

Those of ordinary skill in the art will appreciate that the hardware components and basic configuration depicted in FIG. 6 and described herein may vary. For example, the illustrative components within IHS 600 are not intended to be exhaustive, but rather are representative to highlight components that can be utilized to implement aspects of the present disclosure. For example, other devices/components may be used in addition to or in place of the hardware depicted. The depicted examples do not convey or imply any architectural or other limitations with respect to the presently described embodiments and/or the general disclosure.

Figure 7:
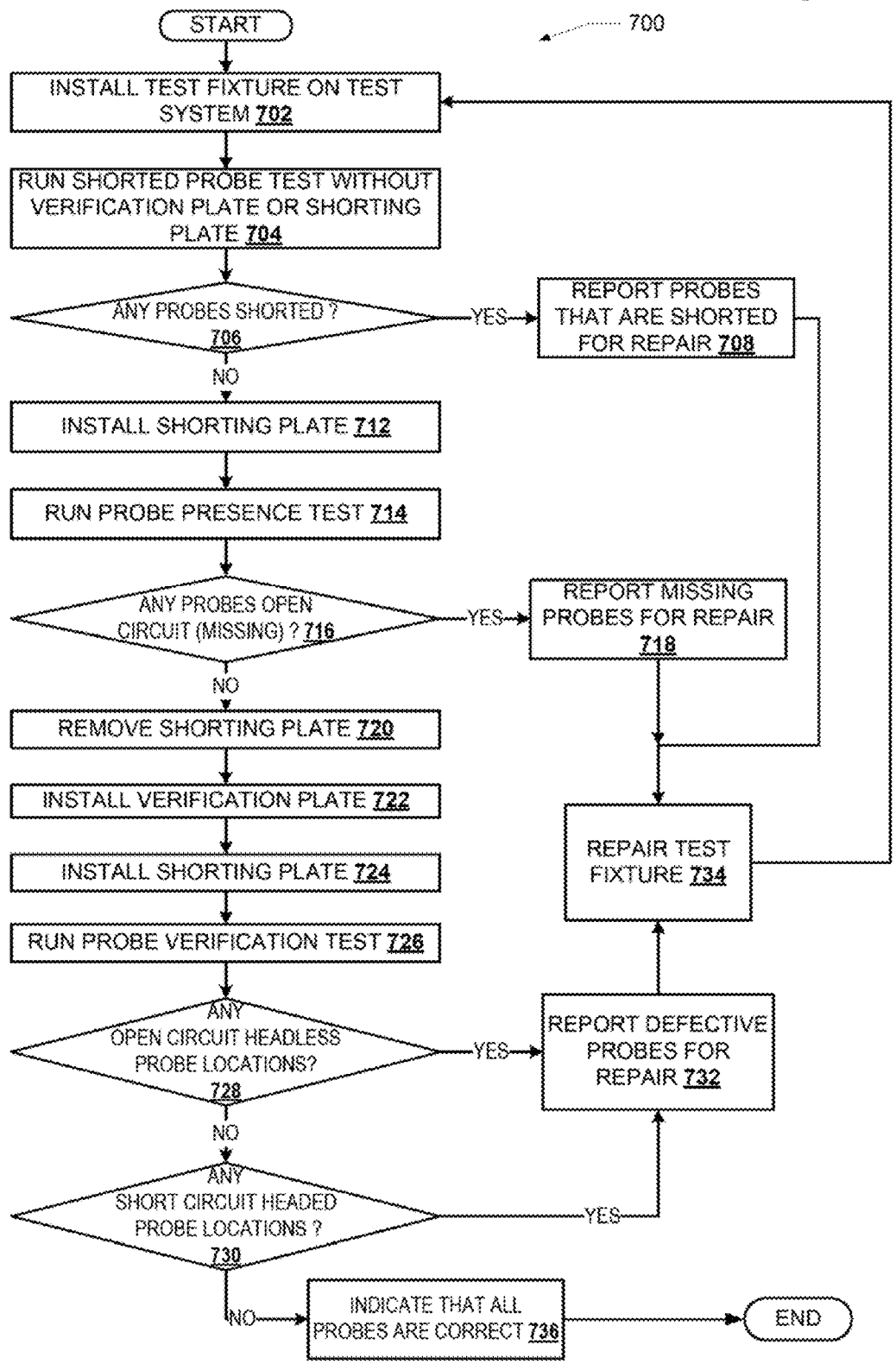
FIG. 7 is a flow chart illustrating one example of the method of testing a test fixture using a test probe verification plate, in accordance with one or more embodiments.

FIG. 7 illustrates a flowchart of an exemplary method by which computer-based PCBA test system 500 operating with assembly 50, as presented within the preceding figures, perform different aspects of the processes that enable one or more embodiments of the disclosure. According to one embodiment, computer-based PCBA test system 500 is configured to test for short circuits and open circuits. The description is provided with general reference to the specific components illustrated within the preceding figures. Generally, the processing and analysis aspects of method 700 are described as being implemented via the execution of code provided by test program software 614 executing within HIS 600 and/or computer 510. It is however appreciated that certain aspects of the described methods may be implemented via other processing devices and/or execution of other code.

FIG. 7 illustrates an example method of testing test fixture 100 to identify and determine if the correct test probes 124/128 are installed in the correct locations in the test fixture 100. Method 700 begins at the start block and proceeds to block 702 where the test fixture 100 is installed on (i.e., communicatively coupled to) the test system 500. At block 704, a shorted probe test is performed without the test probe verification plate 150 and shorting plate 410. With this first test, the computer 510 can determine if any of the test probes are shorted to another test probe and their location 114 in the test fixture. Thus, at decision block 706, computer 510 determines if any of the test probes 124/128 are shorted to another test probe. In response to one or more of the test probes 124/128 being shorted to another test probe (or to the test fixture), computer 510 reports the specific shorted test probes (124/128) that require repair and their location on the test fixture 100 (block 708). A test fixture with defective test probes is repaired (block 734). After repair (block 734), method 700 returns to block 702 and reinitiates the test process.

In response to none of the test probes 124/128 being shorted to another test probe, the shorting plate 410 is installed in place on the test fixture 100 (block 712). At block 714, computer 510 runs a probe presence test and determines the locations 114 of any open circuit (missing) test probes in the test fixture 100. At decision block 716, computer 510 determines if there are open circuit (missing) test probes 124/128. In response to the detection of open circuit test probes (among the test probes 124/128), computer 510 reports the open test probes (124/128) that require repair and their location in the test fixture (block 718). The test fixture with defective test probes is repaired (block 734). After repair (block 734), method 700 returns to block 702 and reinitiates the test process.

In response to none of the test probes 112 having an open circuit in block 716, the shorting plate 410 is removed (block 720). The test probe verification plate 150 is installed on test fixture 100 (block 722). The shorting plate 410 then is installed on test fixture 100 over test probe verification plate 150 and moved into contact with the probe tips 217 of any headless probes 128 that extend through apertures 156 in test probe verification plate 150 (block 724). Because apertures 156 are axially aligned over the headless test probes 128 and the diameter of apertures 156 is greater than the diameter of the headless test probes 128, only the headless test probes 128 can pass through apertures 156 and come into contact with shorting plate 410.

At block 726, computer 510 performs (or runs) a probe verification test. Electrical signals are applied to the headless test probes 128 and the flow of electricity between the headless test probes is monitored. Computer 510 determines if any of the headless test probes 128 have an open circuit and identifies the locations of any of the open circuit headless test probes in the test fixture (block 728). Any headless test probes 128 that are missing from test fixture 100 will result in an open circuit. Also, any headed test probes 124 that are incorrectly installed in a headless test probe location, also will be blocked from contact with shorting plate 410, resulting in an open circuit at that probe location.

Computer 510 analyzes electricity flow associated with each of the test probes to determine if any of the expected headless test probes have an open circuit. The analysis includes comparing a location of each headless test probe that provided a closed circuit with a pre-established probe location mapping for all of the headless test probes that should exist on a correctly configured test fixture. The pre-established probe location mapping provides a correct location for each headless test probe and each headed test probe on the test fixture 100. This information can be stored as test data 612 within storage and/or memory of computer 510.

In response to the detection of any open circuit headless test probes 128, computer 510 reports the defective test probes that require repair and their location (block 732). The test fixture with defective test probes is repaired (block 734). After repair (block 734), method 700 returns to block 702 and reinitiates the test process.

In response to none of the headless test probes 128 having an open circuit in decision block 728, computer 510 determines if there are any short circuited, headed probe locations (decision block 730). Any headless test probes 128 that are incorrectly installed in a headed test probe location will pass through aperture 156 and contact shorting plate 410, leading to detection of a short circuit at that probe location. In response to the detection of a short circuit in the location expected for any headed test probes 124, computer 510 reports the defective test probes that require repair and their position (block 732). The test fixture with defective test probes is repaired (block 734). After repair (block 734), method 700 returns to block 702 and reinitiates the test process. In response to no defects being detected, computer 510 indicates that the headed test probes 124 and the headless test probes 128 are correctly installed in their corresponding correct positions in test fixture 100 (block 736). Method 700 then ends.

Figure 8:
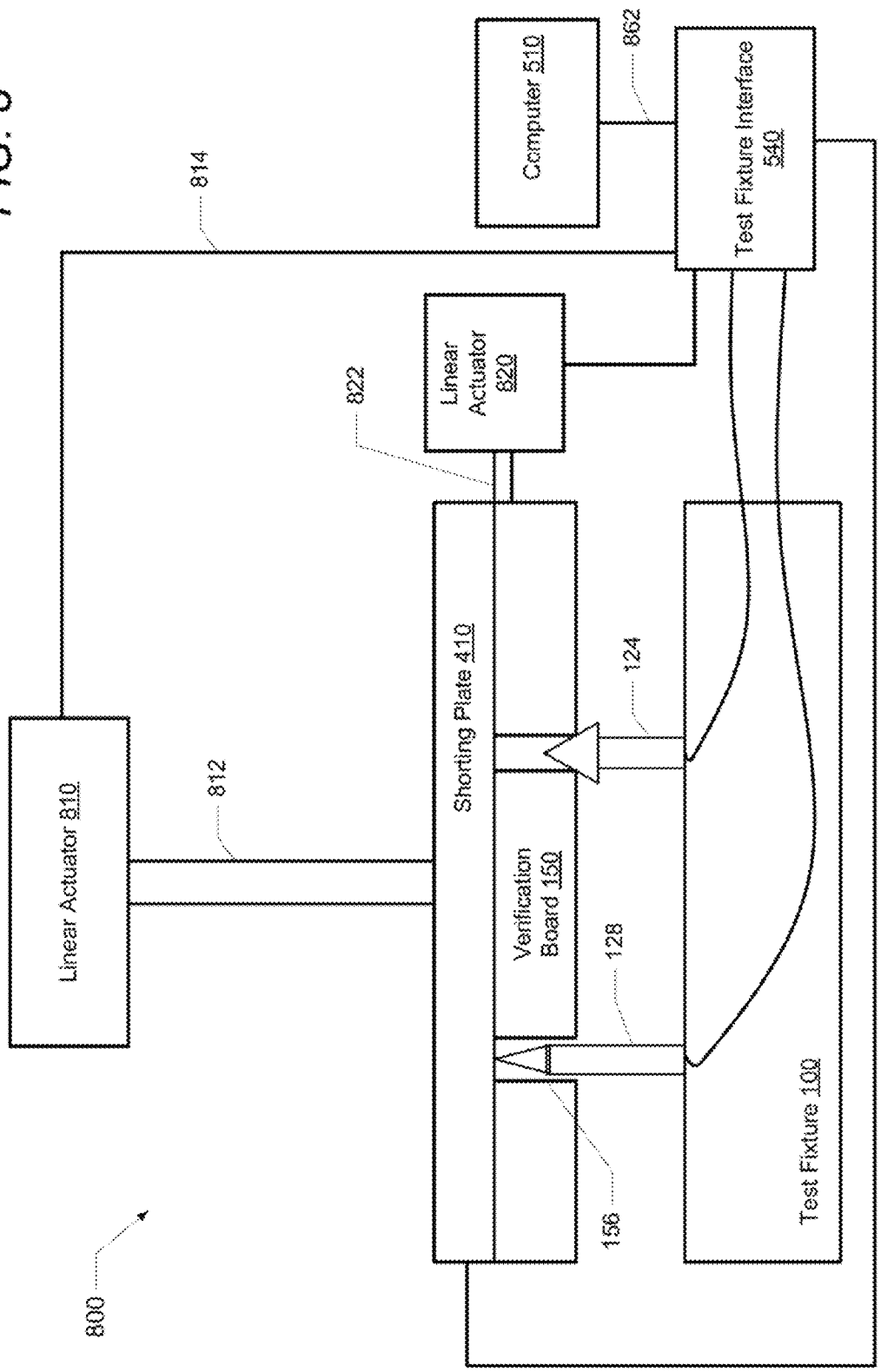
FIG. 8 illustrates an alternative embodiment of a test fixture and test probe verification plate within which various aspects of the disclosure can be implemented using automation, in accordance with one or more embodiments.

FIG. 8 illustrates an optional alternative embodiment of a test fixture and test probe verification plate with possible automation of the test operation. Automated test assembly 800 includes linear actuators 810 and 820 that can position and move the combination of test probe verification plate 150 and shorting plate 175, into a specific test position. In the illustrative embodiment, linear actuator 810 is attached to shorting plate 410 by a shaft 812 and linear actuator 820 is attached to verification plate 150 by a shaft 822. Linear actuator 810 moves the combined shorting plate 410 and verification plate 150 in an upward and downward direction along an axis that is perpendicular to test fixture 100. Linear actuator 820 moves the combined shorting plate 410 and verification plate 150 in a horizontal direction along an axis that is parallel to test fixture 100. Computer 510 can provide signals to position verification board 150 and shorting plate 410 through the use of linear actuators 810 and 820.

The actuator 810 is communicatively coupled to test fixture interface 540 via a communication cable 814. Test fixture interface 540 is also in indirect electrical communication with the shorting plate 410, headed test probes 124 and headless test probes 128 by electrical cables 862. Through test fixture interface 540, computer 510 can trigger the selective application of electrical signals to one or more of the headed test probes 124 or the headless test probes 128 and analyze the flow of electricity between any pairs or more of headed test probes 124 or headless test probes 128 or between any one of headed test probes 124 or headless test probes 128 and shorting plate 175. The above implementation is by way of example and provided solely for the purpose of suggesting one possible automated implementation of the concepts disclosed herein. It is appreciated that one or more of these processes can be performed manually, without the use of a computer, in one or more embodiments.

In the above described flow chart, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, assembly (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing assembly to produce a machine, such that the instructions, which execute via the processor of the computer or other programmable data processing assembly, performs the method for implementing the functions/acts specified in the flowchart and/or block diagram block or blocks.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, microcode, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, assembly, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, assembly, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method of testing a test fixture having a plurality of test probes, the test probes including one or more headed test probes and one or more headless test probes, the method comprising:
    installing the test fixture on a test system;
    providing a test probe verification plate having a plurality of apertures at specific locations relative to expected positions of the one or more headed and one or more headless probes on the test fixture, where each aperture has a perimeter dimension or orientation that allows the headless probe to pass through the aperture, but which prevents the headed probe from passing through the aperture;
    executing at least one of a shorted probe test, a probe presence test, and a probe verification test, the probe verification test including:
        providing a conductive shorting plate;
        positioning the test probe verification plate relative to the test fixture such that the plurality of apertures align with positions of the test probes of the test fixture, such that the one or more headless probes positioned in alignment with a corresponding aperture extends through the corresponding aperture, while each headed probe is prevented from extending through an aperture with which the headed probe is aligned;
        moving the shorting plate into a position at which the shorting plate would engage with any test probe that extends through its corresponding aperture of the test probe verification plate;
        transmitting an electrical signal to each of the test probes;
        analyzing electricity flow associated with each of the test probes to determine if any of the expected headless test probes have an open circuit, where said analyzing further includes comparing a location of each headless test probe that provided a closed circuit with a pre-established probe location mapping for all of the headless test probes that should exist on a correctly configured test fixture, where the pre-established probe location mapping provides a correct location for each headless test probe and each headed test probe on the test fixture;
        in response to detecting an open circuit at locations of the test fixture at which one or more of the headless test probes are expected to be provided on the test fixture, indicating that one or more of the headless test probes are one of (a) defective in the test fixture and (b) missing from the test fixture; and
        identifying at least one corresponding location in the test fixture of a defective or missing headless test probes.

2. The method of claim 1, further comprising:
    determining, based on the transmitting of the electrical signal, if there are any extra shorted headless test probes included on the test fixture; and
    in response to detecting one or more extra shorted headless test probes: identifying, as a defective probe installation, the extra shorted headless test probes and a corresponding test fixture location of the extra shorted headless test probes.

3. The method of claim 2, further comprising:
    in response to there not being any extra shorted headless test probes within the test fixture, indicating that the headless test probes are correctly installed in the test fixture.

4. The method of claim 1, wherein executing the shorted probe test comprises:
    moving the shorting plate into a position at which the shorting plate would engage with any test probe that extends through its corresponding aperture of the test probe verification plate;
    transmitting an electrical signal to each of the test probes;
    determining if any of the test probes are shorted; and
    in response to any of the test probes being shorted, determine whether only correct probes in the test fixture are shorted by comparing a location of each of the shorted test probes against the pre-established probe location mapping indicating which probes are correct probes to short during the shorted probe test.

5. The method of claim 1, wherein executing the probe presence test comprises:
    moving the shorting plate into a position at which the shorting plate would engage with any test probe that extends through its corresponding aperture of the test probe verification plate;
    transmitting an electrical signal to each of the test probes;
    determining if any of the test probes have an open circuit; and
    in response to any of the test probes having an open circuit, indicating that one or more of the test probes has an open circuit and identifying the location of the open circuit test probes in the test fixture.

6. A system for testing a test fixture having a plurality of test probes, the system comprising:
    a test fixture having one or more headed test probes and one or more headless test probes;
    a conductive shorting plate;
    a test probe verification plate having a plurality of apertures at specific locations relative to expected positions of the one or more headed and one or more headless probes on the test fixture, where each aperture has a perimeter dimension or orientation that allows the headless probe to pass through the aperture, but prevents the headed probe from passing through the aperture; and
    wherein the test probe verification plate is positioned relative to the test fixture such that the plurality of apertures align with positions of the test probes of the test fixture, such that the one or more headless probes positioned in alignment with a corresponding aperture extends through the corresponding aperture, while each headed probe is prevented from extending through an aperture with which the headed probe is aligned.

7. The system of claim 6, wherein the headed test probes have at least one larger dimension than a corresponding dimension of the apertures.

8. The system of claim 6, wherein each correctly installed headed test probe is blocked from extending through a corresponding aperture in the test probe verification plate.

9. The system of claim 6, wherein each headless test probe that is incorrectly installed in a headed test probe position passes through a corresponding aperture and contacts the shorting plate.

10. The system of claim 6, further comprising:
    an actuator coupled to the shorting plate for moving the shorting plate towards the test fixture and into contact with the headless test probes that extend through the apertures.

11. The system of claim 6, wherein each of the headed test probes and the headless test probes are spring loaded such that the headed test probes and the headless test probes are biased away from the test fixture.

12. The system of claim 6, further comprising:
a controller coupled to and in communication with the test fixture for controlling operation of the test fixture, wherein the controller comprises logic that:
moves the shorting plate into a position at which the shorting plate would engage with any test probe that extends through its corresponding aperture of the test probe verification plate;
transmits an electrical signal to each of the test probes;
analyzes electricity flow associated with each of the test probes to determine if any of the of expected headless test probes have an open circuit, where said analyzing further includes comparing a location of each headless test probe that provided a closed circuit with a pre-established probe location mapping for all of the headless test probes that should exist on a correctly configured test fixture, where the pre-established probe location mapping provides a correct location for each headless test probe and each headed test probe on the test fixture; and
in response to detecting an open circuit at locations of the test fixture at which one or more of the headless test probes are expected to be provided on the test fixture:
indicates that one or more of the headless test probes are one of (a) defective in the test fixture and (b) missing from the test fixture; and
identifies at least one corresponding location in the test fixture of a defective or missing headless test probes.

13. The system of claim 12, wherein the controller further comprises logic that:
determines, based on the transmitted electrical signal, if there are any extra shorted headless test probes included on the test fixture; and
in response to detecting one or more extra shorted headless test probes, identifying the extra shorted headless test probes and a corresponding test fixture location of the extra shorted headless test probes.

14. An information handling system comprising:
a controller including logic for controlling operation of a test system that includes:
a test fixture having a base;
a plurality of test probes mounted to the base and extending away from the base, the test probes including a first set of headed test probes and a second set of headless test probes;
a conductive shorting plate; and
a test probe verification plate having a plurality of apertures therein;
wherein the controller comprises logic that when executed causes the controller to perform one or more of: a shorted probe test; a probe presence test; and a probe verification test, wherein the logic for the probe verification test includes logic that causes the controller to:
position the test probe verification plate relative to the test fixture such that the plurality of apertures align with positions of the test probes of the test fixture, such that the one or more headless probes positioned in alignment with a corresponding aperture extends through the corresponding aperture, while each headed probe is prevented from extending through an aperture with which the headed probe is aligned;
move the shorting plate into a position at which the shorting plate would engage with any test probe that extends through its corresponding aperture of the test probe verification plate;
transmit an electrical signal to each of the test probes;
analyze electricity flow associated with each of the test probes to determine if any of the expected headless test probes have an open circuit, where said analyzing further includes comparing a location of each headless test probe that provided a closed circuit with a pre-established probe location mapping for all of the headless test probes that should exist on a correctly configured test fixture, where the pre-established probe location mapping provides a correct location for each headless test probe and each headed test probe on the test fixture;
in response to detecting an open circuit at locations of the test fixture at which one or more of the headless test probes are expected to be provided on the test fixture, indicate that one or more of the headless test probes are one of (a) defective in the test fixture and (b) missing from the test fixture; and
identify at least one corresponding location in the test fixture of a defective or missing headless test probes.

15. The information handling system of claim 14, wherein the controller further comprises logic that:
determines, based on the transmitting of the electrical signal, if there are any extra shorted headless test probes included on the test fixture; and
in response to detecting one or more extra shorted headless test probes, identifies the extra shorted headless test probes and a corresponding test fixture location of the extra shorted headless test probes.

16. The information handling system of claim 15, wherein the controller further comprises logic that:
in response to there not being any extra shorted headless test probes within the test fixture, indicates that the headless test probes are correctly installed in the test fixture.

17. The information handling system of claim 14, wherein the controller logic that executes the shorted probe test comprises logic that:
moves the shorting plate into a position at which the shorting plate would engage with any test probe that extends through its corresponding aperture of the test probe verification plate;
transmits an electrical signal to each of the test probes;
determines if any of the test probes are shorted; and
in response to any of the test probes being shorted, determines whether only correct probes in the test fixture are shorted by comparing a location of each of the shorted test probes against the pre-established probe location mapping indicating which probes are correct probes to short during the shorted probe test.

18. The information handling system of claim 14, wherein the controller logic that executes the probe presence test comprises logic that:
moves the shorting plate into a position at which the shorting plate would engage with any test probe that extends through its corresponding aperture of the test probe verification plate;
transmits an electrical signal to each of the test probes;
determines if any of the test probes have an open circuit; and
in response to any of the test probes having an open circuit, indicates that one or more of the test probes has an open circuit and identifies the location of the open circuit test probes in the test fixture.

19. The information handling system of claim 14, wherein the test probe verification plate is positioned between the test probes and the shorting plate.

20. The information handling system of claim 14, further comprising:
   an actuator coupled to the shorting plate and in communication with the controller, the actuator configured to move the shorting plate into engagement with the headed and headless test probes; and
   each of the headed test probes and the headless test probes including a spring that biases the headed test probes and the headless test probes away from the test fixture.

* * * * *